United States Patent
Pennaz et al.

(10) Patent No.: US 7,300,863 B2
(45) Date of Patent: Nov. 27, 2007

(54) CIRCUIT CHIP CONNECTOR AND METHOD OF CONNECTING A CIRCUIT CHIP

(75) Inventors: Thomas J. Pennaz, Champlin, MN (US); Noel H. Eberhardt, Cupertino, CA (US)

(73) Assignee: Motorola, Inc., Schaumburg, IL (US)

( * ) Notice: Subject to any disclaimer, the term of this patent is extended or adjusted under 35 U.S.C. 154(b) by 610 days.

(21) Appl. No.: 10/843,174

(22) Filed: May 11, 2004

(65) Prior Publication Data

US 2004/0212544 A1 Oct. 28, 2004

Related U.S. Application Data

(62) Division of application No. 09/532,807, filed on Mar. 21, 2000, now Pat. No. 6,891,110.

(60) Provisional application No. 60/125,842, filed on Mar. 24, 1999, provisional application No. 60/149,486, filed on Aug. 18, 1999.

(51) Int. Cl.
*H01L 21/44* (2006.01)

(52) U.S. Cl. .............................. 438/612; 257/E21.511; 257/E21.523

(58) Field of Classification Search ................. 438/26, 438/612; 257/E21.511, E21.512, E21.523
See application file for complete search history.

(56) References Cited

U.S. PATENT DOCUMENTS

| 4,000,054 A | 12/1976 | Marcantonio |
| 4,141,055 A | 2/1979 | Berry et al. |
| 4,215,359 A | 7/1980 | Schermer et al. |
| 4,963,002 A | 10/1990 | Tagusa et al. |
| 4,977,441 A | 12/1990 | Ohtani et al. |
| 5,046,953 A | 9/1991 | Shreeve et al. |
| 5,068,714 A | 11/1991 | Seipler |
| 5,086,558 A | 2/1992 | Grube et al. |
| 5,162,613 A | 11/1992 | Schoenthaler |
| 5,225,966 A | 7/1993 | Basavanhally et al. |
| 5,304,460 A | 4/1994 | Fulton et al. |
| 5,360,946 A | 11/1994 | Feger et al. |
| 5,528,222 A * | 6/1996 | Moskowitz et al. ..... 340/572.7 |
| 5,566,441 A | 10/1996 | Marsh et al. |
| 5,586,892 A | 12/1996 | Sato |
| 5,769,996 A | 6/1998 | McArdle et al. |
| 5,776,278 A | 7/1998 | Tuttle et al. |

(Continued)

FOREIGN PATENT DOCUMENTS

DE 197 16 342 A1 10/1998

(Continued)

OTHER PUBLICATIONS

"Improved Method for C-4 Chip Joint", IBM Technical Disclosure Bulletin, IBM Corp., New York, US vol. 31, No. 6, Nov. 1, 1988 pp. 335-336, XP000054208, ISSN: 0018-8689.

*Primary Examiner*—W. David Coleman

(57) ABSTRACT

An interposer and a method of manufacturing a flexible radio frequency (RF) type device having an IC and thin film circuits, such as an antenna. The device is made by using an easy-to-insert interposer subassembly with pre-positioned ICs to mechanically and electrically attach an IC to the thin film circuit. A method of mass producing radio frequency devices comprising antennas and ICs on interposers that are physically and electrically connected to the antennas using a pressure sensitive adhesive.

14 Claims, 3 Drawing Sheets

U.S. PATENT DOCUMENTS

| | | |
|---|---|---|
| 5,786,628 A | 7/1998 | Beilstein, Jr. et al. |
| 5,826,328 A | 10/1998 | Brady et al. |
| 6,027,027 A * | 2/2000 | Smithgall .................. 235/488 |
| 6,104,280 A * | 8/2000 | Tuttle et al. ............. 340/10.42 |
| 6,115,262 A | 9/2000 | Brunner et al. |
| 6,169,253 B1 | 1/2001 | Jairazbhoy et al. |
| 6,265,977 B1 * | 7/2001 | Vega et al. .............. 340/572.7 |
| 6,268,796 B1 | 7/2001 | Gnadinger et al. |
| 6,285,324 B1 | 9/2001 | Korisch et al. |
| 6,429,831 B2 | 8/2002 | Babb |

FOREIGN PATENT DOCUMENTS

| | | |
|---|---|---|
| EP | 0 277 606 A2 | 8/1988 |
| GB | 2 115 431 A | 9/1983 |
| JP | 5182709 A | 7/1993 |

* cited by examiner

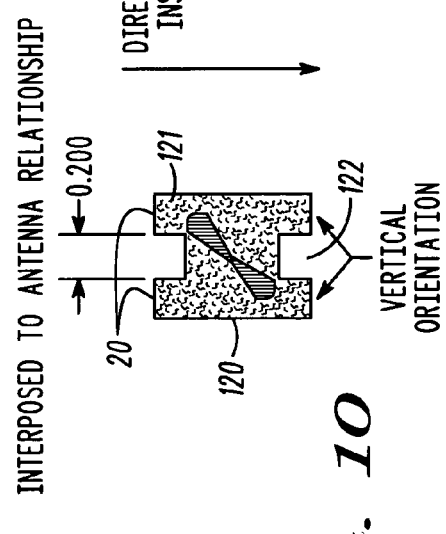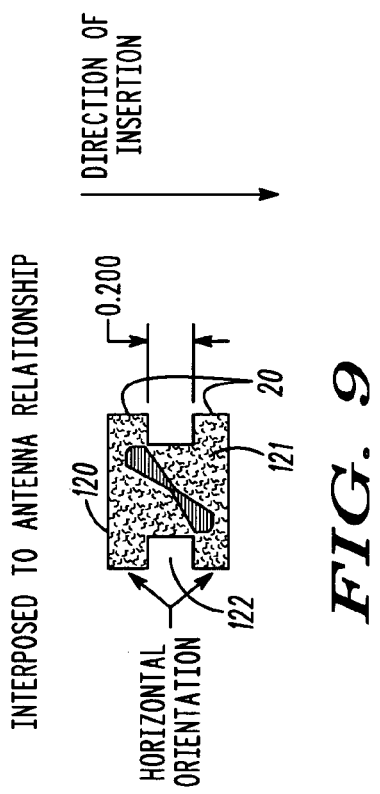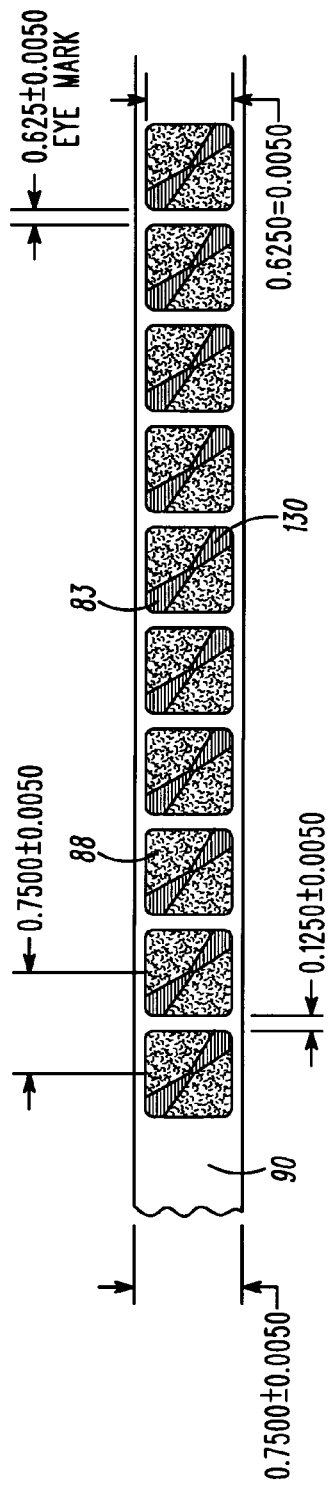

CIRCUIT CHIP CONNECTOR AND METHOD OF CONNECTING A CIRCUIT CHIP

RELATED U.S. APPLICATION DATA

This application is a divisional of copending U.S. Ser. No. 09/532,807, filed on Mar. 21,2000, entitled "CIRCUIT CHIP CONNECTOR AND METHOD OF CONNECTING A CIRCUIT CHIP," by Thomas J. Pennaz, et al. (U.S. Pat. No. 6,891,110), assigned commonly with the present application, the disclosure of which is hereby incorporated by reference herein in its entirety, and from which priority under 35 U.S.C. §120 is hereby claimed.

The application (U.S. Ser. No. 09/532,807) has partial priority to U.S. Provisional Application Ser. No. 60/125,842, filed Mar. 24, 1999 and U.S. Provisional Application Ser. No. 60/149,486, filed Aug. 18, 1999.

BACKGROUND OF THE INVENTION

The present invention relates to interposers and a method of mounting an integrated circuit chip (IC) or similar device using such an interposer connected across a gap between thin film circuits, such as two conductive film sections of a conductive film antenna, or similar circuit made from conductive film or other conductive flex circuit. More specifically, the invention is directed toward a method of mass-producing devices, such as radio frequency identification tags (RFIDs), by mounting integrated circuit chips (ICs) on interposers that are then physically and electrically connected to the circuit, such as a conductive film antenna, using a pressure sensitive conductive adhesive.

Radio frequency (RF) devices such as RFIDs can be used for inventory management, highway toll express passes, and many other purposes that are suited for interrogation of the device. Such devices can be made by incorporating an appropriate IC across the gap of two conductive surfaces of a thin conductive film antenna. Such an antenna may be formed by introducing a gap between a conductive film surface, thus creating two conductive portions or halves. The IC contains encoded data for identification purposes. The IC and the antenna act together as a transponder, which receives an RF signal and modifies it according to the data encoded on the IC.

The invention is an interposer that includes a thin substrate having two printed conductive ink pads. These pads provide a larger effective electrical contact area than ICs precisely aligned for direct placement without an interposer. The larger area reduces the accuracy required for placement of ICs during manufacture while still providing effective electrical connection. The substrate is coated with a pressure sensitive conductive adhesive that allows an IC to be electrically and mechanically mounted across the conductive ink pads. Pressure sensitive adhesives are preferred, but this production method is not limited only to pressure sensitive applications. The IC can be mounted across the gap of the interposer, ideally with the same adhesive as used to mount the interposer-IC subassembly to the circuit.

Methods are known in the art of connecting ICs to thin metallic foils, e.g., leadframes. In these methods, the IC is affixed on top of the leadframe, then the leadframe is connected to electrical connections on the IC by wire bonding techniques. Because of the fragile nature of the bonding, the connections are encapsulated for support. The present invention uses an interposer having conductive adhesive to both mechanically join and electrically connect the IC to a thin metallic film antenna, thus maintaining flexibility and providing a more robust connection. However, the scope of the present invention includes use in any thin film circuit application requiring placement of an IC or other flush mount components.

The prior art methods have difficulty in aligning ICs with base substrates or vice versa. IC placement was accomplished by first placing the individual base substrate in alignment with an IC, such that the bonding leads of the substrate are aligned to the connectors on the IC. Alternately, if the substrate is the base piece, the IC had to be precisely aligned for a physical and electrical connection. The relatively small bonding leads or pads on the substrate and IC provide a small effective connection area and greatly restrain the tolerances for placement of an IC across the gap of a thin metallic film circuit substrate. IC placement and mounting are serious limitations for high speed manufacturing.

A prior method of making a RF tag includes using a chip placement machine that mounts ICs between two separate conductive portions of a thin film antenna. This method requires the precise alignment of the IC between a gap of approximately 0.017 inch between the antenna portions. Such tolerances greatly reduce line speeds. This method is acceptable for high-priced items that can be produced at slow line speed. The chip placement machine cannot be readily used for high speed application of ICs on low cost devices. Also, a chip placement machine is relatively costly to purchase and operate. The interposer with a pre-positioned IC overcomes this required precision so that a convertor, such as a label printer, can affix ICs with a high line speed as required for uses such as packaging or other disposable products incorporating RFID tags or similar devices. A converter can use existing technology to apply the IC mounted on an interposer without the need to purchase a chip placement machine.

Previous methods also required bonding such as thermosonic; lasersonic; soldering; or wire bonding. Such methods typically require more process steps and often have defects due to the application of heat in soldering or wire bonding. Further, wave soldering or reflow ovens often expose components to high temperatures that may cause damage to the components. These difficult methods are replaced by applying an interposer of the present invention having a pre-positioned IC to the base substrate (i.e., antenna halves) with conductive adhesive. No heat needs to be applied in placing and connecting the interposer-chip subassembly to the substrate circuit. Heat and high humidity can be detrimental to chips. The pressure sensitive anisotropically conductive adhesive used in the present invention overcomes these bonding limitations and potential defect causing steps.

Current technology relies on the use of a conductive tape applied as a free film to attach the interposer to the RFID antenna or similar circuit. Significant flexibility, improved efficiency and lower cost are obtained by using a printable conductive adhesive. To form an aperture in a tape, a relatively difficult step of punching a hole is required. The adhesive of the present invention is printed over the conductor area and serves to attach the interposer to the antenna halves, both physically and electrically. It may be printed or applied in any pattern including having an aperture or recess.

Other techniques for bonding ICs to conductive circuit patterns of a substrate are known in the art. One such method uses an anisotropically conductive adhesive between raised areas (pads) for bonding on the substrate and matching bonding raised areas of the IC. The adhesive was typically an insulative polymer containing conductive particles that simultaneously contact a raised connection of the IC and a matching raised area of the substrate to provide interconnection. The conductive particles do not conduct in the lateral or horizontal direction since they transmit current only in the vertical direction between the substrate and device bonding raised areas. Such conduction is "anisotropic." The polymer is cured after mounting the IC on the substrate that thereafter provides a permanent structural bond in addition to a conductive connection. The replacement of solder bond connections by anisotropic conductive adhesives can often reduce assembly costs, can accommodate relatively high concentrations of conductive connections, and can make devices more amenable to repair and reconstruction. Similar techniques are needed to bond ICs to thin film circuit substrates, such as antenna halves, without significant curing times, without excessive heat, and without matching bonding raised areas in precise alignment. The present method uses pressure sensitive anisotropically conductive adhesive between the IC mounted on an interposer and the antenna halves (base substrate) to solve these concerns. Pressure sensitive adhesives are selected for ease of application, but other adhesives are available though not preferred.

Prior adhesives with conductive particles that simultaneously contact a raised connection of the IC and a matching raised area of the substrate to provide interconnection were not used with interposers and required precise alignment of the components and were only usable in one orientation. Also, many disposable substrates, such as thin polymeric films, cannot tolerate the high temperatures associated with curing.

The ICs were previously encapsulated by the application of a chip face encapsulant material on the ICs that are attached to the antenna. Typically, an epoxy was used. Besides long curing times, the use of epoxy may cause undesirable friction when joining circuits to an interposer. The present interposer can secure the IC, rather than placing an epoxy encapsulant over the surface of the IC. The curing of an epoxy encapsulant often takes hours and is not conducive to high speed production. The present invention overcomes the long cure time of such encapsulants by using a pressure sensitive conductive adhesive and an interposer that can secure the IC. Also, filled epoxy is more rigid so devices requiring flexibility are not well suited for epoxy encapsulants over the surface of the IC. The interposer of the present invention maintains flexibility.

ICs have become drastically less expensive, and are often not the most expensive part of a device. An IC may be incorporated into a device, such as an RFID tag, a luggage tag or prescription label, in which the device substrate would be the most expensive component. The "expensive device substrate," for lack of a better term, can be spoiled if the IC is not mounted correctly or if there is a short circuit in the mounted IC. Isolating the IC placement to the less expensive interposer subassembly allows IC defects to be detected before the final assembly to the more expensive device substrate, such as a thin film antenna. An IC on an interposer will make for less spoilage of the "expensive device substrate." Spoilage is limited to the lowest cost component when a low-cost interposer with an IC is used.

This relates to another critical problem overcome by the interposer-chip combination. Certain applications require sequential production of expensive device substrates, such as numbered pharmaceutical labels or packages. If a bad IC is inserted in such a sequence-critical application, the web would have to be re-spliced, effectively shutting down production until completed. By isolating the individual interposer-chip combination as a subassembly, the interposer can be applied by a standard head that can repeat without shutting down when a bad IC is detected so that there are no missing labels or packages in the sequence.

It has therefore been found beneficial to produce an interposer that is inexpensive to mass produce and easy to insert at high line speed, preferably in multiple orientations with respect to the antenna or similar circuit. The present invention incorporates some of the advantages of the existing technology, while alleviating several of the problems associated therewith. Interposers are well suited for high volume applications because they offer low-cost solutions and easy attachment. Additionally, the improved method of manufacturing a thin RF transponder with such an interposer is necessary for such mass production.

SUMMARY OF THE INVENTION

It is a primary objective of the present invention to provide a method for the quick and easy attachment of ICs to a RF antenna, or a similar circuit made from a metallized film substrate or other metallized flex circuit, by using an interposer subassembly having a preattached IC on a printed conductive pad and using an anisotropically conductive pressure sensitive adhesive.

In a preferred embodiment, the invention may be described as a method of making thin, flexible transponders, such as RFID labels and tags. RFIDs require an RF antenna and an appropriate IC encoded with data. The present invention uses an interposer having an IC as a subassembly that is attached to a thin conductive film antenna. An RF antenna is formed by creating a gap between two portions of metal on a thin metallic film. The gap may be formed by using a laser or by masking the gap before the metallic film is applied to the thin film. The IC via an interposer is connected across the gap between the antenna portions, thus creating an RFID. No wiring or heating is required because the interposer has two pads, such as carbon ink printed, that make electrical contact with the isolated antenna portions, via an electrically conductive adhesive. A pressure sensitive adhesive will not require significant curing time for attachment to become effective.

With the disclosed interposer, an IC is not directly mechanically and electrically attached to the antenna. The IC is attached to an interposer so that it can be positioned at the connection ends of the antenna circuit. The interposer comprises a base substrate film with two printed pads. An IC is connected between the two electrically isolated pads. The interposer can provide added structural support and can secure the internal components. Other flush mount components, such as LEDs, can be attached using similar techniques. This removes the limitations for precise placement on the leads of a circuit. Additionally, IC's can be mounted on conventional circuits via an interposer.

Placement of the IC is easier with the interposer. The gap between antenna portions is critical for proper functioning of an RF antenna. The antenna gap is dictated by the spacing between the IC pads and requires the IC to be precisely inserted (by machine placement for instance) between a space of 0.014 and 0.020 inch, which is a typical gap between IC pads. The interposer isolates the IC placement to this critical gap by limiting it to a subassembly having a critical gap created between two relatively large separate conductive interposer pads. The IC is placed across the critical gap between the interposer pads. Since the connector pads of the interposer can contact any portion of the antenna pad to establish electrical connection, placement of the interposer is not constrained by the relatively small critical interposer gap. However, the interposer pads still maintain an electrical connection across the non-critical antenna gap. This removes the IC placement constraint created by the critical antenna gap located on the antenna circuit substrate while maintaining the function of the critical gap in the circuit. The larger area of the interposer pads reduces the accuracy required for placement of ICs during manufacture while still providing effective electrical connection. This allows an IC to be placed across the gap with greater placement tolerances. An example of such an interposer pad would be a printed carbon ink that is 0.20 inches extended from the IC connection area. Silver is an expensive substitute for carbon ink and the tolerance can dictate the necessary extension of the pad from the IC connection area. It is contemplated that the carbon ink or silver ink pad is not printed on the entire interposer surface.

With the present disclosure, insertion can be used with many devices. The interposer pattern or repeat is constant thereby simplifying the critical IC placement step. There is still a critical gap, but it is in a constant format. Variability of the antenna pattern adds significant complexity to the direct IC attachment process. For example, tickets, luggage tags, anti-theft devices or inventory control devices have different layouts for antennas or other circuits. Direct attachment would require a reconfiguration for each different antenna or circuit layout. By standardizing the IC placement via the interposer in a preferred embodiment, the finished part can vary widely and not encumber the process.

In a preferred embodiment disclosed herein, numerous interposer-chip subassemblies are prepared for subsequent attachment to antennas by starting with numerous printed interposers on a web to which a plurality of ICs is attached. Nearly 1000 interposers can be placed on each foot of web with a width of 18 inches. Preferably, each interposer-chip subassembly is separate and rectangular for easy application like a label. The group of interposer-chip subassemblies is inexpensive to mass produce and easy to insert at high line speed with less spoilage of devices due to defective ICs. The interposers are designed for a minimum press speed of 80 feet per minute.

This invention also includes a geometry of components that allows for attachment of the interposer chip subcomponent regardless of the orientation of the antenna or similar circuit to which it is attached. Current IC mounting technology requires the IC be mounted across the interposer gap. Interposers are inserted in the web direction to be accurately placed on the antenna or similar circuit. The gap must presently be perpendicular to the interposer web direction due to IC orientation. Therefore, without the improved geometry, the interposer reel must be oriented parallel to the antenna web being printed.

Due to space limitation, press configuration, web optimization or other considerations, it may be desirable to orient the antenna gaps either parallel or perpendicular to the web direction during printing or application. In fact, in extreme-cases, it may be desirable to orient the antenna gaps at angles other than 0° or 90° to the web, in which case, current geometries fail.

This limitation can be overcome through geometry that allows universal orientation of the antenna to the web and allows efficient interposer insertion regardless of antenna orientation. The improved geometry includes conductive ink pads that are in the shape of a butterfly, propeller or bow-tie pattern preferably with a separation line between each portion. The butterfly, propeller or bow-tie pattern extends from one corner of the label to the opposite corner. The pattern must maintain a gap perpendicular to the web to allow for IC placement across the gap. Preferably, a conductive adhesive is printed or applied around the edges of the label with a recess of no adhesive in the center.

It is also contemplated that a metallized film package can be used as an antenna for an RFID device. Metallized films and papers are common components of packaging and labels used for barrier properties, opacity, and desirable graphics. Due to the conductivity of a metallized surface, the material can function as a RF antenna. With a laser, metal can be removed from the package film, but leaving the base film intact, so that there are two electrically and physically isolated portions of metallic surface. A gap must be incorporated between the portions to provide electrical isolation. Another non-conductive substrate, such as a paper or polymer, could be laminated to the metallized film so that the packaging maintains two electrically isolated surfaces. An appropriate integrated circuit article preferably using an interposer will convert the package into an RFID device (or a similar device) if access to the portions of the metallized surface is available. The interposer can be applied to the package (RFID antenna) as described herein to replace the less versatile bar code. A separate substrate of the device that contains an antenna layer would not be required because the metallized film layer forming the antenna is a portion of the packaging film.

BRIEF DESCRIPTION OF THE DRAWINGS

FIG. 9 shows an orientation of the interposer to a horizontal antenna or similar circuit;

FIG. 10 shows an orientation of the interposer to a vertical antenna or similar circuit; and FIG. 11 shows a liner, conductive adhesive and conductive ink as an assembly step.

DETAILED DESCRIPTION OF THE INVENTION

Figure 1:
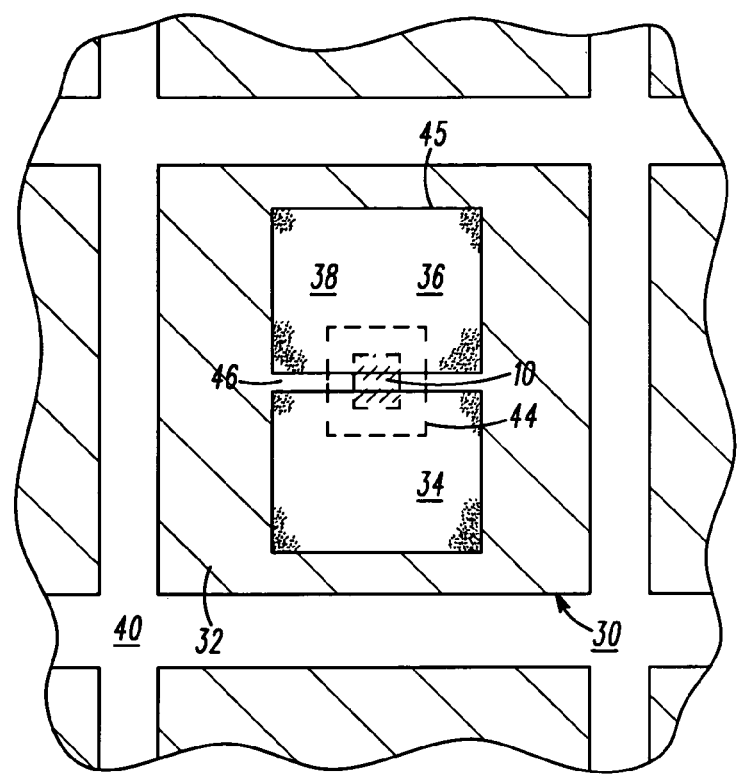
FIG. 1 shows a top view of an interposer-chip subassembly of the present invention positioned on a web containing a series of such subassemblies.

A thin film circuit, shown as an antenna 20 (or a similar circuit made from metallized film or other metallized flex circuit) can be made from a thin etched or stamped foil, typically manufactured from a thin foil of copper, copper-alloy, or nickel-iron alloy by stamping or etching. The etching or stamping creates patterns on strips that become antennas. Other methods of making an antenna include printing a conductive ink. This invention relates to ICs 10, which are joined and electrically connected to individual antennas 20, focusing on the interposer 30, its substrate 32, and the printing of contact pads 34 and 36 thereon onto which the IC 10 is incorporated. The layer of anisotropically conductive pressure sensitive adhesive 38 makes contact with connectors of the IC 10 as to interconnect the antenna 20 and the IC 10. Pressure sensitive adhesives are selected for ease of application, but other adhesives are available though not necessarily preferred. Two different adhesives, both conductive, can be used in association with the interposer 30. A pressure sensitive conductive adhesive is preferred for attachment of the interposer 30 to the antenna 20 or similar circuit, and a different adhesive can be used to attach the IC 10 to the interposer 30, such as a conductive hot melt.

The subassembly includes IC 10 on the interposer 30 such that the IC 10 is in contact with both pads 34 and 36 of the interposer 30. The subassembly is adhered to a base circuit substrate to form a device. In a preferred embodiment, the subassembly is adhered to a thin metallic film antenna 20 to form an RFID.

FIG. 1 shows an interposer 30 having a substrate 32 (on a matrix web 40) with an attached IC 10. The interposer 30 is ideally as small as possible such as 0.400 inches square, not including the matrix web portion (which is typically 0.060 inches in length between each interposer). The interposer 30 preferably has a geometric shape, such as a rectangle or square, that allows for ease of insertion by a standard press head. An eighteen-inch web can contain thirty-six interposers 30 across for use in mass production.

Figure 2:
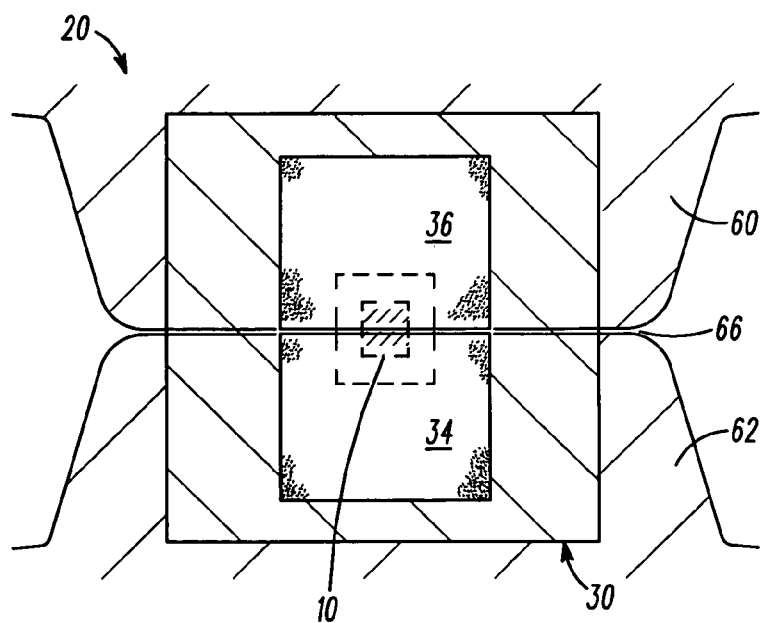
FIG. 2 shows an interposer-chip subassembly of the present invention across the gap of a thin metallic film of an antenna.

FIG. 1 indicates a raised non-contact area 44 of the interposer 30 around the IC 10 resulting from the height of the IC 10. The non-contact area 44 is created when the interposer 30 is applied across a gap 66 of a thin metallic film antenna 20, as shown in FIG. 2. This raised area 44 assumes a height of 0.006 inch for the IC and a ten-degree contact angle.

The interposer substrate 32 can be a variety of film or paper. Flexible substrates, such a polymeric film or paper, are preferred. Ideally, the surface of the substrate 32 is ink-receptive if a carbon pad (34 or 36) or a similar pad is printed.

The pads 34 and 36 are conductive surfaces that are designed to make electrical contact with antenna portions 60 and 62. Pads 34 and 36 provide a large effective electrical contact, which reduces the accuracy required for placement of ICs during manufacture while still providing effective electrical connection. As shown in FIG. 1, the pads 34 and 36 would conduct only in a direction transverse to pads 34 and 36. The pads 34 and 36 physically and electrically contact the antenna portions 60 and 62, via conductive (preferably pressure sensitive) adhesive 38, as shown in FIG. 2. There is a gap 46 between the pads 34 and 36 so that they are electrically isolated surfaces. The gap 46 between the pads 34 and 36 is not as critical as the gap 66 between antenna portions 60 and 62, which makes it easier to insert the IC 10 attached to an interposer 30. As shown in FIG. 1, the carbon ink area of the pads (34 and 36) is 0.04 square inches (0.2 by 0.2 inch for each pad).

Preferably, the pads 34 and 36 are silver or carbon printed. Known printing techniques such as flexographic, screen, or rotogravure are suitable. The preferable resistance is less than 100 ohms per square. (Resistivity is measured on a strip with a 10:1 length to width ratio. Ohm/square is determined by dividing the resistance measurement along the length by 10.) The choice of material depends on the costs and level of conductivity required. The lowest possible resistance is ideally preferred. Carbon is approximately 100 ohms per square compared to less than one ohm per square for silver, but silver is approximately ten times as expensive. Certain metallized films (i.e., vapor deposited) and foils have greater conductivity.

The leading edge 45 of the printed pad 36 can serve as an alignment mark in printing. As shown in FIG. 1, leading edge 45 is 0.200 inch in length. It does not extend the whole length of the substrate 32 and is representative of a printed carbon ink. The pads 34 and 36 may be smaller if a more conductive material such as silver is used. The carbon ink or silver ink pad need not be printed on the entire interposer surface.

A conductive adhesive film 38 secures the components of the device, such as an RFID tag. The conductive adhesive can be applied or printed over any conductor including metallized film, printed conductive inks (either carbon or silver or combinations thereof), foils or other conductors. Ideally, the same adhesive can be used to mount and hold the IC 10 that bonds the device together. A pressure sensitive anisotropically conductive adhesive is most desirable to mount the IC 10 to the interposer 30, as well as to bond the resulting tag or device together. The conductive adhesive is preferably printable. The pressure sensitive adhesive film 38 will adhere the components together with an electrically conductive film that transmits current only anisotropically.

The conductive adhesive may also serve to hold the interposer 30 to a liner, which allows handling of interposers 30 in roll form to be applied as labels from reels. The adhesive properties of the conductive adhesive are adjusted with the liner to facilitate the handling of interposers during IC attachment and to provide release properties to allow mechanical insertion in high volume applications.

The pressure sensitive adhesive does not require the application of heat to adhere the components. The pressure sensitive adhesive can be cured through radiation (UV or EB) or can be conventionally dried (either as solvent-based or water-based). UV cured adhesives have been used as the preferred curing/drying method, and for high-speed production, a quick curing solution is required. H. B. Fuller has a part for such a formula, namely Solar Cure RT-7575. Ideally, the anisotropically conductive adhesive is a printable, UV-quick curable, pressure sensitive adhesive that maintains its flexibility. Adhesives to be avoided include those that require UV, heat or microwave curing that have an unacceptable cure time for high speed production. The pressure sensitive adhesive film 38 ideally has a minimal resistance, but metal or other conductors adversely affect the adhesion. The pressure sensitive adhesive film 38 must be suitable for high speed applications, such as having properties that avoid bubbling. The adhesive must provide sufficient bonding and electrical properties at a high speed insertion. It should preferably maintain flexibility without losing its connection.

The adhesive is preferably printed over the conductor area and serves to attach the interposer to the antenna halves, both physically and electrically. The adhesive can be printed either by flexographic, gravure or screen printing or other suitable printing methods.

Figure 3:
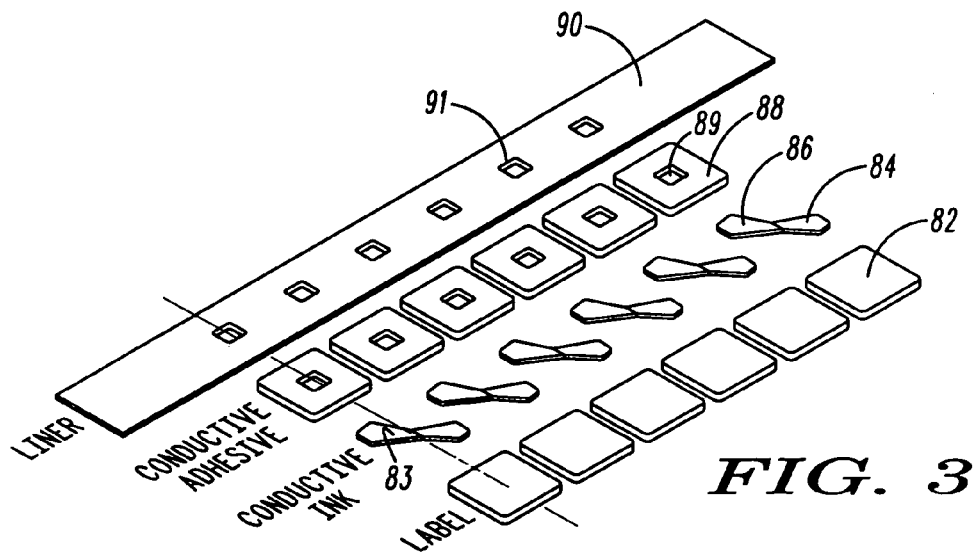
FIG. 3 is an expanded perspective view of a liner, conductive adhesive, conductive ink, and label.

As shown in FIGS. 3 through 11, the preferred geometry allows universal orientation of the antenna or similar circuit to the web and allows efficient interposer insertion regardless of the orientation of the antenna or similar circuit. FIG. 3 is an expanded perspective view of a label 82, conductive ink 83 with two pads 84 and 86, a conductive adhesive 88 with a recess 89, and liner 90 with an aperture 91.

Figure 4:
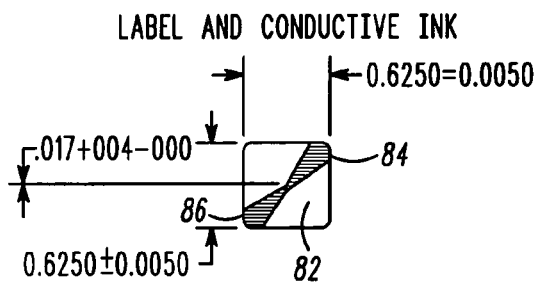
FIG. 4 shows a label and conductive ink.
Figure 5:
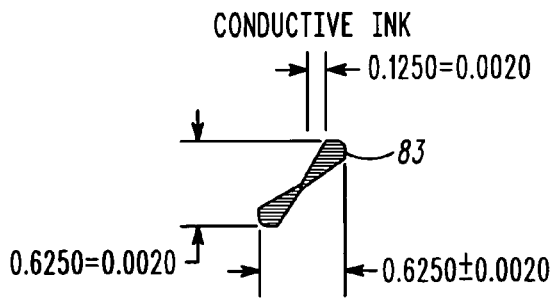
FIG. 5 is a preferred pattern for the conductive ink.
Figure 6:
FIG. 6 shows a die and conductive ink.

FIG. 4 shows a label 82 and conductive ink pads 84 and 86 that are in the shape of a propeller, but may be shaped in a butterfly or bow-tie pattern, preferably with a separation line between each portion as can best be seen in FIG. 3. The pattern has a gap or separation line that is perpendicular to the web to allow for IC placement across the gap. The butterfly, propeller, or bow-tie pattern preferably extends from one corner of the label 82 to the opposite corner. FIG. 5 is a preferred pattern for the conductive ink 83, and FIG. 6 shows a die and conductive ink 83.

Figure 7:
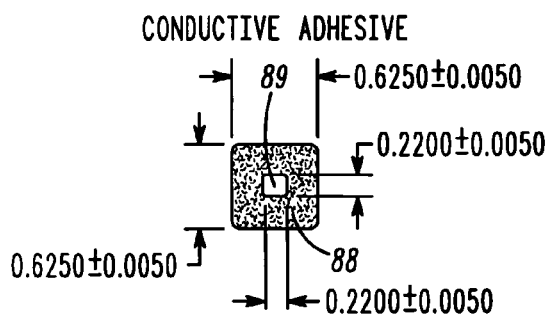
FIG. 7 is a preferred pattern for the conductive adhesive.

FIG. 7 is a preferred pattern for the conductive adhesive 88. Preferably, a conductive adhesive 88 is printed or applied around the edges of a label with a recess 89 of no adhesive in the center.

Figure 8:
FIG. 8 illustrates the conductive ink and adhesive.

FIG. 8 illustrates the conductive ink 83 and the conductive adhesive 88 as they relate to each other geometrically.

As can be best seen in FIGS. 9 and 10, the improved geometry allows universal orientation of the antenna portions 120 and 121 to the direction of the web and allows efficient interposer 30 insertion regardless of antenna 20 orientation. The geometry of components allows for attachment of the interposer chip subcomponent regardless of the orientation of the antenna 20 or similar circuit. The antenna gaps 122 may be oriented either parallel or perpendicular to the web direction during printing or insertion.

FIG. 9 shows an orientation of a horizontal antenna 20 or similar circuit to the interposer 30, and FIG. 10 shows an orientation of a vertical antenna 20 or similar circuit to the interposer 30.

FIG. 11 shows a liner 90, conductive adhesive 88 and conductive ink 83 as an assembly step, which can be used as a reel. FIG. 1 shows an interposer 30 on a matrix web 40. Different methods and label printing equipment require different configurations of the interposers 30. A leading edge or even a trailing edge of each component can serve as an eye mark 130 for signaling information to production or quality control equipment.

In a preferred method, the method of making a RF type device, without the application of heat, comprises the steps of:

1. providing a thin film substrate circuit, such as antenna portions formed from metallized film or other metallized flex circuit on a polymeric film;
2. forming an interposer 30 having two separate printed electrical contact pads 34 and 36, which are preferably printed in a butterfly, propeller, or bow-tie pattern with a separation line between each portion. A conductive adhesive can be applied or printed over any conductor including metallized film, printed conductive inks (either carbon or silver or combinations thereof), foils or other conductors.
3. placing an IC 10 on the interposer 30 such that the IC 10 is in contact with both pads 34 and 36 of the interposer 30 to form a subassembly;
4. locating the interposer-chip subassembly over a portion of the thin film substrate circuit, such as over the gap between two metallized portions of a thin metallic film antenna;
5. electrically connecting the IC to the thin film substrate circuit, such as by placing the interposer over the circuit, connecting it to each antenna portion, thereby securing the IC and at least a portion of the circuit; and
6. cutting the circuit substrate to form individual devices.

The method of applying the IC mounted on an interposer can be accomplished using a standard press head, which is existing technology for many convertors. Preferably, numerous interposer-chip subassemblies are prepared for subsequent attachment to circuits to form devices at high line speeds. Also, an additional step of detecting defects on the ICs on the interposers can be performed before applying the subassembly to the thin film circuit. If defects are found, the defective IC assembly will be skipped.

Although the preferred embodiment of the invention is illustrated and described in connection with a particular type of IC, antenna circuit, and tag, it can be adapted for use with a variety of devices. Other embodiments and equivalent interposers and methods are envisioned within the scope of the invention. The examples of gaps between antenna portions are for illustration purposes, and this interposer-chip subassembly can be used with a wide variety of configurations. Various features of the invention have been particularly shown and described in connection with the illustrated embodiment of the invention, however, it must be understood that these particular arrangements merely illustrate and that the invention is to be given its fullest interpretation within the terms of the appended claims.

What is claimed is:

1. A method of making a radio frequency device comprising the steps of:
    providing a thin film substrate circuit;
    forming an interposer having a first contact pad and a second contact pad, wherein a pattern of first and second contact pads of the interposer is selected from a group consisting of butterfly, propeller, and bow-tie pattern with a gap between the pads;
    placing an integrated circuit chip on the interposer such that the integrated circuit chip is in contact with the first contact pad and the second contact pad of the interposer to form a subassembly;
    locating the interposer-chip subassembly over a portion of the thin film substrate circuit; and
    electrically connecting the integrated circuit chip to the thin film substrate circuit by placing the interposer-chip subassembly in contact with the substrate circuit, thereby securing the integrated circuit chip to at least the portion of the substrate circuit.

2. The method of making the radio frequency device of claim 1 characterized by a freedom from application of heat.

3. The method of making the radio frequency device of claim 1 wherein a pattern of the pads allows universal orientation of the substrate circuit to the interposer and allows efficient interposer insertion regardless of orientation of the substrate circuit.

4. The method of making the radio frequency device of claim 1 wherein the step of electrically connecting the integrated circuit chip to the thin film substrate circuit by placing the interposer-chip subassembly in contact with the substrate circuit is performed, both physically and electrically, with a conductive pressure sensitive adhesive.

5. The method of making the radio frequency device of claim 1 wherein the step of placing the integrated circuit chip on the interposer such that the integrated circuit chip is in contact with the first and second contact pads of the interposer to form the subassembly is performed with a conductive pressure sensitive adhesive.

6. The method of making the radio frequency device of claim 1 wherein the step of placing the integrated circuit chip on the interposer such that the integrated circuit chip is in contact with the first and second contact pads of the interposer to form the subassembly and the step of electrically connecting the integrated circuit chip to the thin film substrate circuit by placing the interposer-chip subassembly in contact with the substrate circuit are both performed with the same anisotropically conductive pressure sensitive adhesive.

7. The method of making the radio frequency device of claim 5 wherein the conductive pressure sensitive adhesive is an anisotropically conductive adhesive.

8. The method of making the radio frequency device of claim 5 further comprising curing the conductive adhesive through radiation.

9. The method of making the radio frequency device of claim 8 wherein the curing the conductive adhesive is ultraviolet curing.

10. A method of making a radio frequency device comprising the steps of:
- providing a thin film substrate circuit, wherein the thin film substrate circuit includes metallized antenna halves formed on a polymeric film;
- forming an interposer having a first contact pad and a second contact pad, wherein a pattern of first and second contact pads of the interposer is selected from a group consisting of butterfly, propeller, and bow-tie pattern with a gap between the first and second contact pads;
- placing an integrated circuit chip on the interposer such that the integrated circuit chip is in contact with the first contact pad and the second contact pad of the interposer to form a subassembly;
- locating the interposer-chip subassembly over a portion of the thin film substrate circuit; and
- electrically connecting the integrated circuit chip to the thin film substrate circuit by placing the interposer-chip subassembly in contact with the substrate circuit, thereby securing the integrated circuit chip to at least the portion of the substrate circuit.

11. The method of making the radio frequency device of claim 10 wherein the step of locating the interposer-chip subassembly over the portion of the thin film substrate circuit is over a separation gap between the metallized halves of a metallic film antenna.

12. The method of making the radio frequency device of claim 11 wherein the step of electrically connecting the integrated circuit chip to the thin film substrate circuit includes the step of placing the interposer in contact with the substrate circuit by connecting the integrated circuit chip to each metallized antenna half.

13. A method of making a radio frequency device comprising the steps of:
- providing a thin film substrate circuit;
- forming an interposer having first and second contact pads wherein a pattern of first and second contact pads of the interposer is selected from a group consisting of butterfly, propeller, and bow-tie pattern with a gap between the first and second contact pads;
- placing an integrated circuit chip on the interposer such that the integrated circuit chip is in contact with the first contact pad and the second contact pad of the interposer to form a subassembly;
- detecting defects in the integrated circuit chip of the subassembly;
- locating the interposer-chip subassembly over a portion of the thin film substrate circuit; and
- electrically connecting the integrated circuit chip to the thin film substrate circuit by placing the interposer-chip subassembly in contact with the substrate circuit, thereby securing the integrated circuit chip to at least the portion of the substrate circuit.

14. The method of making the radio frequency device of claim 13 including an additional step of isolating and skipping placement of the subassembly having the detected defect in contact with the thin film substrate circuit.

* * * * *